United States Patent [19]

Sunada

[11] Patent Number: 5,508,557
[45] Date of Patent: Apr. 16, 1996

[54] SURFACE MOUNTING TYPE DIODE

[75] Inventor: Shigemasa Sunada, Ukyo, Japan

[73] Assignee: Rohm Co., Ltd., Kyoto, Japan

[21] Appl. No.: 296,585

[22] Filed: Aug. 29, 1994

Related U.S. Application Data

[63] Continuation of Ser. No. 132,243, Oct. 6, 1993, abandoned.

[30] Foreign Application Priority Data

Oct. 9, 1992 [JP] Japan ..................... 4-272079

[51] Int. Cl.⁶ ..................... H01L 23/48; H01L 23/52
[52] U.S. Cl. ..................... 257/692; 257/787; 257/730
[58] Field of Search ..................... 257/678, 692, 257/690, 730, 735, 666, 675, 787

[56] References Cited

U.S. PATENT DOCUMENTS

| 4,777,520 | 10/1988 | Nambu et al. | 257/730 |
| 5,023,702 | 6/1991 | Micic et al. | 257/730 |
| 5,184,211 | 2/1993 | Fox | 257/678 |
| 5,227,662 | 7/1993 | Ohno et al. | 257/666 |

FOREIGN PATENT DOCUMENTS

| 61-4261 | 1/1986 | Japan . |
| 62-298146 | 12/1987 | Japan . |
| 217664 | 1/1990 | Japan . |
| 2240952 | 9/1990 | Japan . |
| 366150 | 3/1991 | Japan . |
| 4-98861 | 3/1992 | Japan . |
| 4215465 | 8/1992 | Japan . |

Primary Examiner—Jerome Jackson, Jr.
Assistant Examiner—Nathan K. Kelley
Attorney, Agent, or Firm—William H. Eilberg

[57] ABSTRACT

A surface mounting type diode is provided which comprises: a diode chip; a pair of leads held in electrical conduction with the diode chip, each of the leads including an inner end, an outer end, a first bend closer to the inner end, a second bend closer to the outer end, and an intermediate portion between the first and second bends; and a resin package enclosing the diode chip together with part of the respective leads, the resin package having a flat bottom surface. The inner end, first bend, second bend and intermediate portion of the lead are contained in the resin package. Further, the outer end of the lead has an exposed flat mounting surface flush with the bottom surface of the resin package.

2 Claims, 3 Drawing Sheets

SURFACE MOUNTING TYPE DIODE

This application is a continuation of application Ser. No. 08/132,243, filed Oct. 6, 1993, now abandoned.

BACKGROUND OF THE INVENTION

1. Field of the Invention

This invention relates generally to semiconductor diodes. More particularly, the present invention relates to a surface mounting type diode which has a very small size of about 1 mm for each of length, width and height.

2. Description of the Prior Art

There has been an increasing requirement for size reduction with respect to diodes, like other semiconductor devices, thereby enabling high-density mounting of electronic components on circuit boards. At present, diodes with a size of about 1 mm for each of length, width and height are available. Further, it is convenient to use diodes of the surface mounting type for facilitating mounting to the circuit board.

FIG. 6 of the accompanying drawings shows a typical prior art diode of the surface mounting type. Specifically, the prior art diode designated by reference numeral 11 comprises a molded resin package 12 having a flat bottom surface 12a. The resin package 12 is square or rectangular in plan view and has a very small size of about 1 mm for each of the length, width and height.

The diode 11 further comprises a pair of leads 13, and a semiconductor diode chip 14 bonded on one of the leads 13 in electrical connection therewith. The chip 14 is electrically connected to the other lead through a metal wire 15.

Each of the leads 13 has a first bend 13a closer to a higher inner end 13c, and a second bend 13c closer to a lower outer end 13d. Between the first and second bends 13a, 13b a vertical intermediate portion 13e. The outer end 13d has a flat mounting surface 13f which is used for mounting the diode 11 onto a printed circuit board (not shown).

In manufacture of the prior art diode 11, use is made of a mold which includes an upper mold member 17 having an upper molding cavity 17a, and a lower mold member 18 having a lower molding cavity 18a, as indicated by phantom lines in FIG. 6. The paired leads 3, which may be initially connected to a leadframe (not shown), need be held straight between the respective mold members 17, 18 at the time of molding the resin package 12. After molding the resin package 12, the mold is opened, and the respective leads 3 are cut off from the unillustrated leadframe. Then, each of the leads 3 is bent at two positions 13a, 13b in a manner such that the flat mounting surface 13f of the lead outer end 13d is generally flush with the flat bottom surface 12a of the resin package 12.

According to the prior art arrangement, the inner end 13c of each lead 13 is enclosed in the resin package 12, whereas the respective bends 13a, 13b are located outside the resin package 12. Such an arrangement has been found to give rise to the following problems.

First, since the respective bends 13a, 13b of each lead 13 are positioned outside the resin package 12, it is necessary to perform bending of the lead 3 after forming the resin package 12. Thus, it is extremely difficult or virtually impossible to make the flat mounting surface 13f of the lead outer end 13d accurately flush with the flat bottom surface 12a of the resin package 12.

As a result, the flat bottom surface 12a of the resin package 12 may not be utilized for stably supporting the diode 11 on the printed circuit board, and the support must be provided only by the mounting surface 13f of the lead outer end 13d which is much smaller in area than the bottom surface 12a of the resin package 12. Due to the instability of support, the diode 11 may be improperly mounted on the circuit board. This problem will be particularly remarkable when mounting of the diode 11 is performed by a high-speed mounter which inevitably causes vibration.

Secondly, due to the necessity of bending each of the leads 13 after the formation of the resin package 12, the projecting portion of the lead must be rendered relatively long for facilitating subsequent bending of the lead. Therefore, the length or height of the vertical intermediate portion 13e of the lead becomes inevitably large after bending, and the gravitational center of the diode 11 is also located at a relatively high position, further adding to the instability of support. Further, the long projecting portion of the lead also results in difficulty of reducing the overall size of the diode.

SUMMARY OF THE INVENTION

It is, therefore, an object of the present invention to provide a surface mounting type diode which can be conveniently mounted on a surface of a circuit board at a high speed while also eliminating or reducing the likelihood of improper mounting.

According to the present invention, there is provided a surface mounting type diode comprising: a diode chip; a pair of leads held in electrical conduction with the diode chip, each of the leads including an inner end, an outer end, a first bend closer to the inner end, a second bend closer to the outer end, and an intermediate portion between the first and second bends; and a resin package enclosing the diode chip together with part of the respective leads, the resin package having a flat bottom surface; wherein the inner end, first bend, second bend and intermediate portion of said each lead are contained in the resin package; and wherein the outer end of said each lead has an exposed flat mounting surface flush with the bottom surface of the resin package.

It is advantageous if the diode has its gravitational center located below the height center of the diode because such an arrangement further increases the supporting stability of the diode.

According to a preferred embodiment of the present invention, the inner end of one lead is positioned at the same height as that of the other lead, and the diode chip is directly mounted on the inner end of said one lead in electrical conduction therewith. In this case, the diode chip is electrically connected to the inner end of said other lead through a wire.

According to another preferred embodiment of the present invention, the inner end of one lead is positioned below that of the other lead, and the diode chip is sandwiched between the inner ends of the respective leads in electrical conduction therewith.

Other objects, features and advantages of the present invention will be fully understood from the following detailed description given with reference to the accompanying drawings.

DETAILED DESCRIPTION OF THE PREFERRED EMBODIMENT

Figure 1:
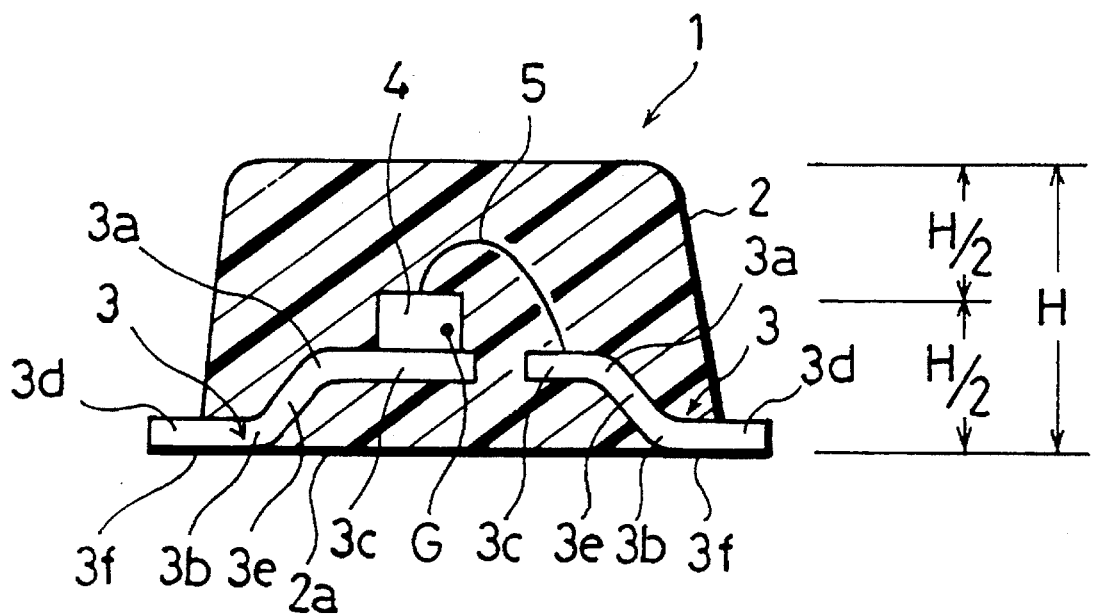
FIG. 1 is a view, in vertical section, showing a surface mounting type diode according to a first embodiment of the present invention.

Referring first to FIG. 1 of the accompanying drawings, there is illustrated a surface mounting type diode 1 according to a first embodiment of the present invention. The diode 1 comprises a molded package 2 made of a thermosetting resin for example. The resin package 2 has a flat bottom surface 2a which may be used for mounting the diode on a printed circuit board (not shown) for example. Though not shown, the resin package 2 is square or rectangular in plan view. The resin package 2 is very small with a size of 0.8–1.2 mm for each of the length, width and height.

The diode 1 further comprises a pair of leads 3, and a semiconductor diode chip 4 bonded on one of the leads 3 in electrical connection therewith. The diode chip 4 is electrically connected to the other lead through a metal wire 5.

Each of the leads 3 has a first bend 3a closer to a higher inner end 3c, and a second bend 3b closer to a lower outer end 3d. Between the first and second bends 3a, 3b is an inclined intermediate portion 3e. In the illustrated embodiment, the inner end 3c of one lead is held at the same height as that of the other lead. The lead may have a thickness of 0.1–0.15 mm and a width of 0.3–0.5 mm for example.

According to the first embodiment of the present invention, the first bend 3a, second bend 3b, inner end 3c and intermediate portion 3e of each lead 3 are contained in the resin package 2, as clearly seen in FIG. 1. Further, the outer end 3d of the lead 3 extends out of the resin package 2 and provides a flat exposed mounting surface 3f which is accurately flush with the flat bottom surface 2a of the resin package 2.

Further, as also shown in FIG. 1, the diode 1 is made to have its gravitational center G located below the height center. In FIG. 1, the height of the diode 1 is represented by reference sign H, so that the height center of the diode is located at a distance H/2 vertically upward from the bottom surface 2a of the resin package 2.

Figure 2:
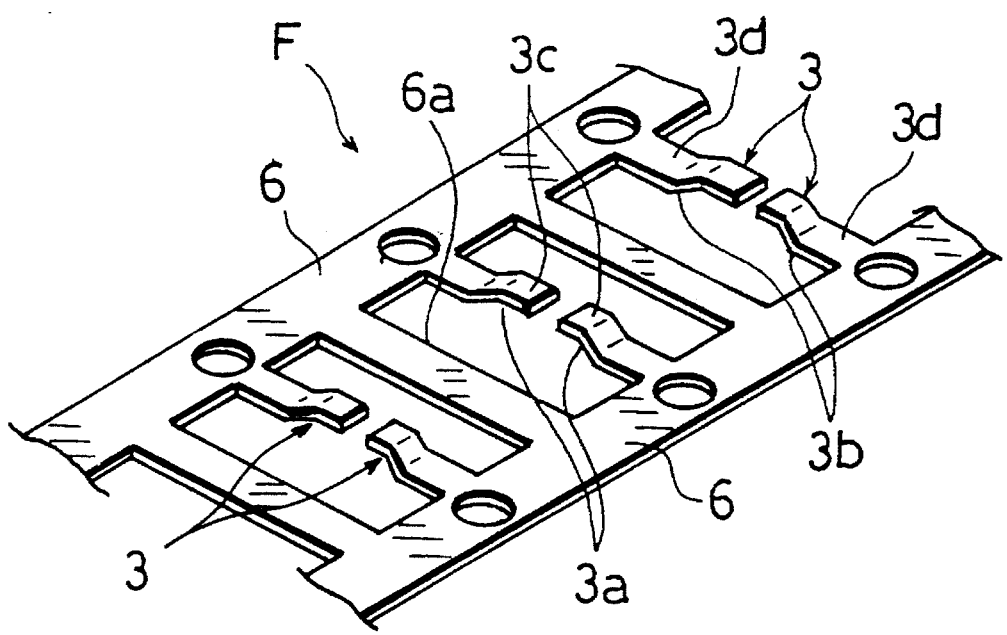
FIG. 2 is a perspective view showing a leadframe used for making the diode of FIG. 1.

A plurality of diodes 1 each having the above-described configuration may be made by suing such a leadframe F as shown in FIG. 2. Specifically, the leadframe F has a parallel pair of side bands 6 which are spaced transversely from each other but connected together by sectioning bars 6a constantly spaced longitudinally of the leadframe. The leadframe further has pairs of leads 3 connected to the side bands, respectively. Such a leadframe may be prepared by punching a thin metal sheet.

In manufacture, each of the leads 3 of the leadframe F is bent at two different positions 3a, 3b, as also shown in FIG. 2. As a result, each lead 3 is made to have a higher inner end 3c and a lower outer end 3d connected together via an inclined intermediate portion 3e, as previously described. Further, the outer end 3d is still maintained in the same plane as the side bands 6.

Figure 3:
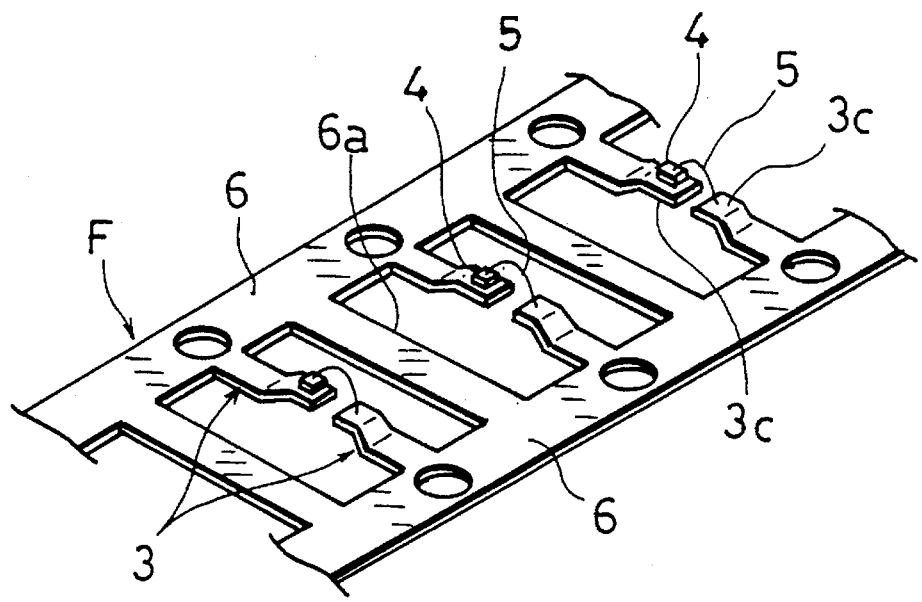
FIG. 3 is a perspective view showing the same leadframe after chip bonding and wire bonding.

Then, a semiconductor diode chip 4 is bonded on one (inner end 3c) of each paired leads 3 into electrical conduction therewith, as shown in FIG. 3. Thereafter, the chip 4 is electrically connected to the other (inner end 3c) of each paired leads 3 through a metal wire 5, as also shown in FIG. 3.

Figure 4:
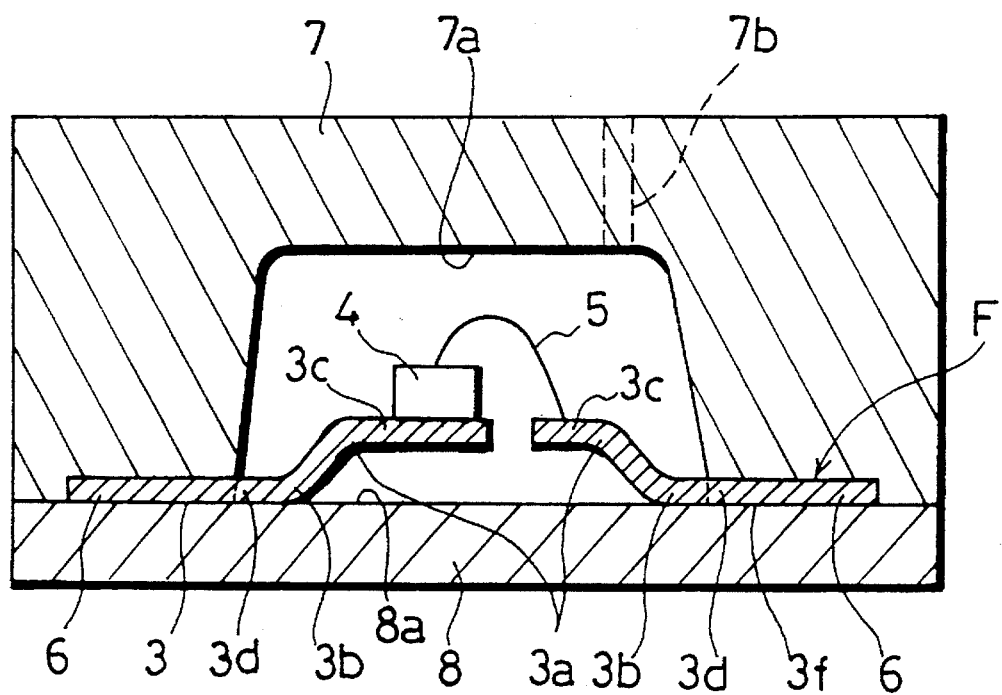
FIG. 4 is a view, in vertical section, showing a mold used for making the diode of FIG. 1.

Then, the leadframe F is placed in a mold which includes an upper mold member 7 and a lower mold member 8, as shown in FIG. 4. The upper mold member 7 has a molding cavity 7a corresponding to each pair of leads 3, and a runner 7b in communication with the molding cavity 7a. The lower mold member 8 may be a simple plate having a flat support surface 8a in intimate contact with the flat mounting surface 3f of each lead.

Then, a fluid resin (not shown in FIG. 4) is introduced into the molding cavity 7a through the runner 7b. Thereafter, the mold is opened when the injected resin is hardened.

Finally, each pair of leads 3 together with the resin package 2 (see FIG. 1) is cut off from the leadframe F (see FIGS. 2 and 3) to provide a product diode 1.

According to the manufacturing method described above, each of the paired leads 3 is bent before molding the resin package 2 because the respective bends 3a, 3b of the lead are contained within the resin package. Thus, the flat support surface 8a of the lower mold member 8 can be utilized for defining the flat bottom surface 2a of the resin package 2 while also supporting the flat mounting surface 3f of the lead 3. As a result, the flat mounting surface 3f of the lead 3 can be rendered accurately flush with the flat bottom surface 2a of the resin package without requiring to subsequently bend the lead 3 outside the resin package 2.

When mounting the above-described diode 1 onto a surface of a printed circuit board, the flat bottom surface 2a of the resin package 2 itself can be utilized for providing a stable support. Thus, the diode 1 can be effectively prevented from being improperly mounted (e.g. inclination and/or positional deviation) even if such mounting is performed by a high-speed mounter. This advantage (namely, stable mounting) is further strengthened if the diode 1 is made to have its gravitational center as low as possible, as already described.

Moreover, since the flat bottom surface 2a of the resin package 2 itself can be utilized for providing a stable support, the projecting outer end 3d of each lead 3 may be rendered short and narrow. Thus, the size of the diode 1 as a whole can be made as small as possible, thereby enabling a high density mounting of electronic components on a printed circuit board.

Figure 5:
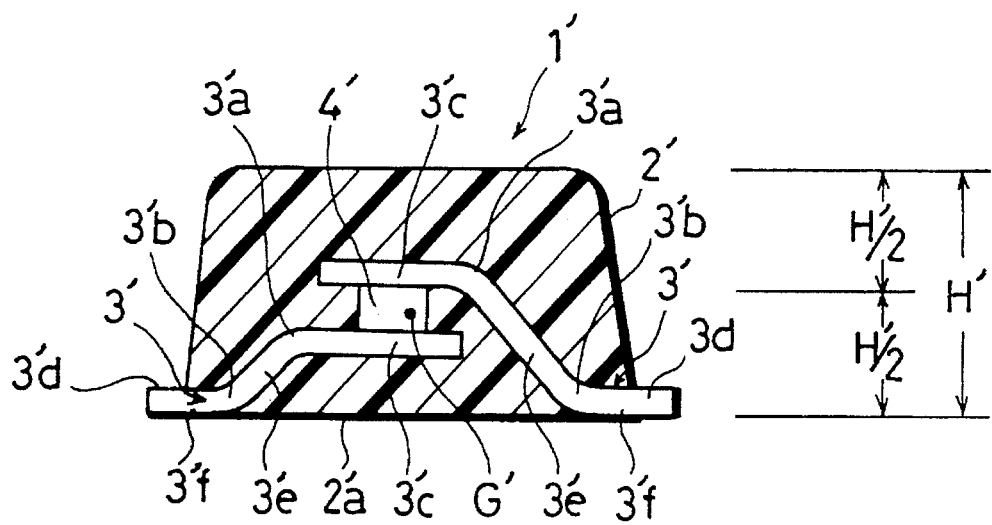
FIG. 5 is a view, in vertical section, showing a surface mounting type diode according to a second embodiment of the present invention.
Figure 6:
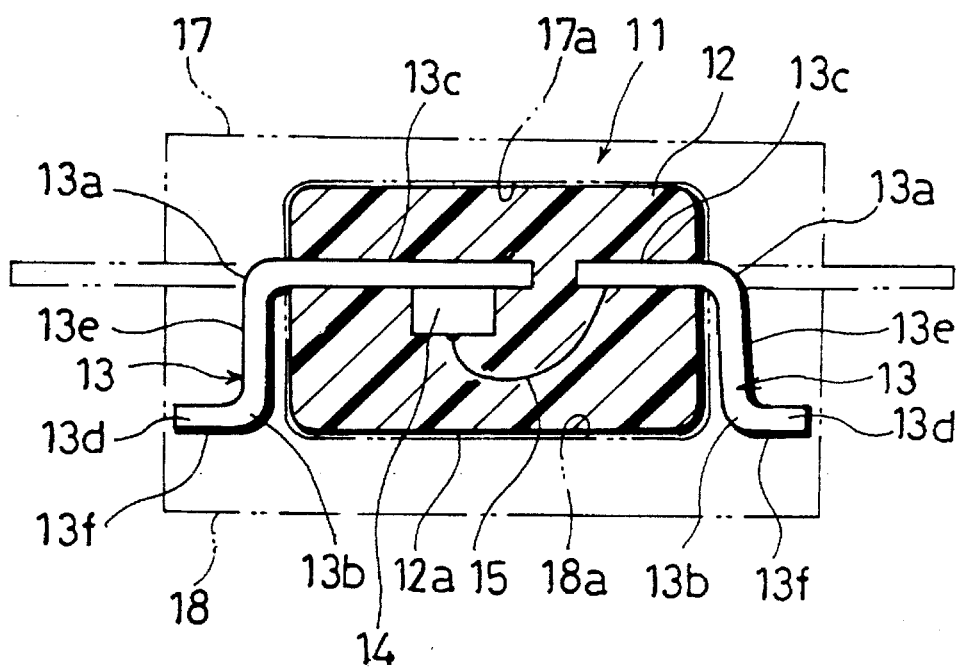
FIG. 6 is a view, in vertical section, showing a prior art surface mounting type diode.

FIG. 5 shows a surface mounting type diode 1' according to a second embodiment of the present invention.

Similarly to the diode of the first embodiment, the diode 1' of the second embodiment comprises a molded package 2' with a flat bottom surface 2a', a pair of leads 3', and a semiconductor diode chip 4'. Further, each of the leads 3' includes a first bend 3a' closer to a higher inner end 3c', a second bend 3b' closer to a lower outer end 3d', and an inclined intermediate portion 3e', and the lower outer end 3d' provides a flat mounting surface 3f'. Moreover, the diode 1' has its gravitational center G' located below the height center which is located at a distance H'/2 vertically upward from the bottom surface 2a' of the resin package 2'.

However, the second embodiment is different from the first embodiment in that the diode chip 4' is sandwiched between the inner ends 3c' of the respective leads 3' in direct electric connection therewith. As a result of such an arrangement, there is no need to use a separate wire while also enjoying all of the advantages of the first embodiment.

The present invention being thus described, it is obvious that the same may be varied in many ways. Such variations are not to be regarded as a departure from the spirit and scope of the invention, and all such variations as would be obvious to those skilled in the art are intended to be included within the scope of the following claims.

I claim:

1. A surface mounting type diode, intended to be mounted on a circuit board, comprising:

a diode chip;

a pair of plate-like leads held in electrical conduction with the diode chip, each of the leads including an inner end, an outer end, a first bend closer to the inner end, a second bend closer to the outer end, and an intermediate portion between the first and second bends; and a single resin package enclosing the diode chip together with part of the respective leads, the resin package having a flat bottom surface and a top surface;

wherein the inner end, first bend, second bend and intermediate portion of said each lead are contained in the single resin package even before mounting the diode;

wherein the outer end of said each lead extends laterally outward from the resin package and has an exposed flat mounting surface flush with the bottom surface of the resin package, wherein the diode comprises a self-contained unit which is entirely distinct from the circuit board, wherein the diode chip is directly mounted on the inner end of one lead in electrical conduction therewith;

wherein a spacing between the inner end of said one lead and the top surface of the resin package is larger than that between the inner end of said one lead and the bottom surface of the resin package;

wherein the diode has a gravitational center located below a height center of the diode; and wherein the inner end of said one lead is positioned below that of the other lead, the diode chip being sandwiched between the inner ends of the respective leads in electrical conduction therewith, the intermediate portion of said other lead being longer than that of said one lead.

2. The diode according to claim 1, wherein the intermediate portion of said each lead is inclined.

* * * * *